United States Patent [19]
Abbas

[11] Patent Number: 4,977,438
[45] Date of Patent: Dec. 11, 1990

[54] TURN-OFF SEMICONDUCTOR COMPONENT AND USE THEREOF

[75] Inventor: Christiaan Abbas, Baden, Switzerland

[73] Assignee: BBC Brown, Boveri Ltd., Baden, Switzerland

[21] Appl. No.: 327,406

[22] Filed: Mar. 23, 1989

Related U.S. Application Data

[63] Continuation of Ser. No. 26,431, Mar. 16, 1987, abandoned.

[30] Foreign Application Priority Data

Mar. 20, 1986 [CH] Switzerland ............... 1114/86

[51] Int. Cl.$^5$ ............... H01L 29/740; H03K 17/720
[52] U.S. Cl. ............... 357/38; 307/305; 307/637; 357/22; 357/55
[58] Field of Search ............... 307/634, 637, 305, 570; 357/22, 38, 43, 55

[56] References Cited

U.S. PATENT DOCUMENTS

| | | | |
|---|---|---|---|
| 2,820,154 | 1/1958 | Kurshaw | 357/22 D |
| 4,086,611 | 4/1978 | Nishizawa et al. | 357/38 |
| 4,326,209 | 4/1982 | Nishizawa et al. | 357/22 D |
| 4,514,747 | 4/1985 | Miyata et al. | 357/58 |
| 4,571,815 | 2/1986 | Baliga et al. | 357/22 E |
| 4,612,448 | 9/1986 | Strack | 307/637 |
| 4,816,891 | 3/1989 | Nishizawa | 357/38 |
| 4,829,348 | 5/1989 | Broich et al. | 357/22 |
| 4,837,608 | 6/1989 | Nishizawa et al. | 357/38 |
| 4,872,044 | 10/1989 | Nishizawa et al. | 357/38 |

FOREIGN PATENT DOCUMENTS

| | | |
|---|---|---|
| 28797 | 5/1981 | European Pat. Off. . |
| 158186 | 10/1985 | European Pat. Off. . |
| 0194946 | 9/1986 | European Pat. Off. . |
| 59-217365 | 12/1984 | Japan . |
| 60-247969 | 12/1985 | Japan . |

*Primary Examiner*—Rolf Hille
*Assistant Examiner*—Peter Toby Brown
*Attorney, Agent, or Firm*—Oblon, Spivak, McClelland, Maier & Neustadt

[57] ABSTRACT

A semiconductor device which can be turned off via a first gate arranged at the cathode side including, a second gate structure comparable to the structure of the first gate arranged at the anode side. During the turning off, the charge carriers can be more rapidly drawn away from the base area of the component via the second anode-side gate and the turn-off behavior can thus be improved. In a dual gate device of the invention, a dual cascode circuit constructed with two MOSFETs.

2 Claims, 7 Drawing Sheets

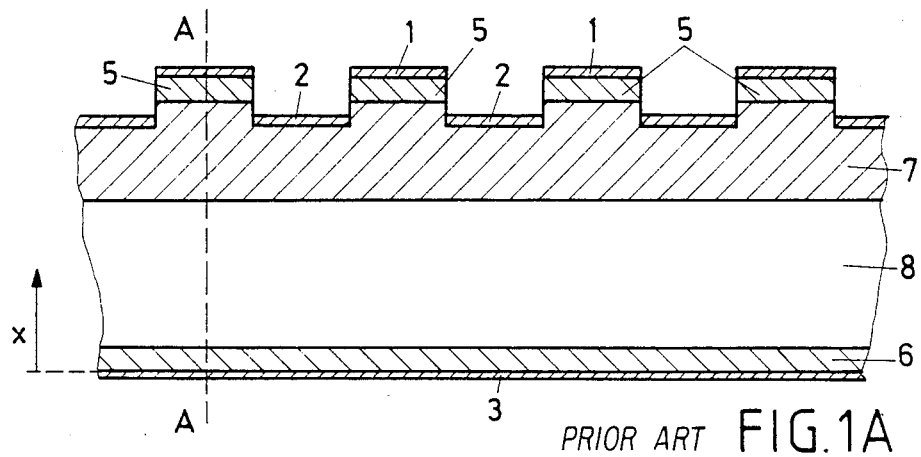
PRIOR ART FIG.1A
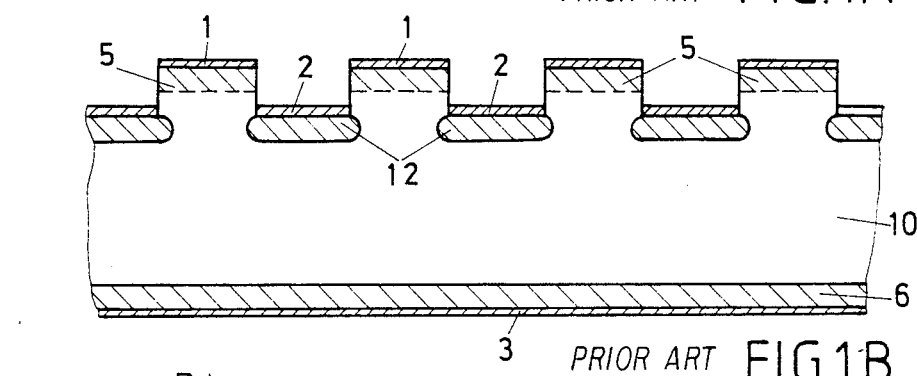
PRIOR ART FIG.1B
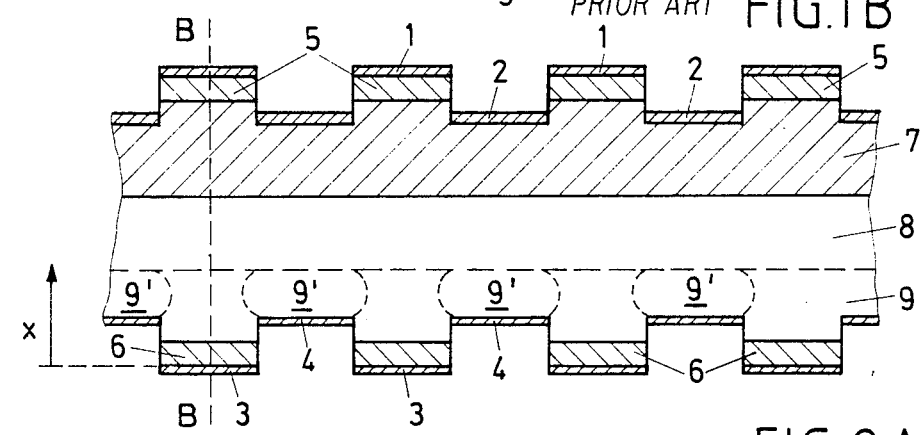
FIG.2A

TURN-OFF SEMICONDUCTOR COMPONENT AND USE THEREOF

This application is a continuation-in-part of application Ser. No. 026,431, filed on Mar. 16, 1987, now abandoned.

BACKGROUND OF THE INVENTION

1. Field of the Invention

This invention relates to a turn-off semiconductor device such as is known from European Pat. No. A01 121 068, and the use of this device.

DISCUSSION OF BACKGROUND

Turn-off power semiconductors, for example, in the form of thyristors which can be turned off via the gate (GTO = Gate Turn Off) are gaining increasing importance in power electronics, in static convertors or controlled electric drive systems.

Such a GTO thyristor as is described in European Pat. No. A1 0 022 355, has between its anode and its cathode a sequence of four layers of different doping which are in most cases designated as p emitter, n base, p base and n emitter The p emitter is connected to the anode contact and the n emitter to the cathode contact. The cathode side of the p base, in turn, is led in some manner to the surface and provided with a suitable gate contact by which the device can be controlled.

In order to be able to achieve a turn-off by the gate, the cathode contact is usually constructed in the form of narrow finger-shaped areas which are surrounded on all sides by the gate contact lying between them. Cathode contact and gate contact are located either in one plane or in different planes in such a manner that the plane of the gate contact is lowered compared with the plane of the cathode contact.

The turn-off speed of such a known GTO thyristor depends, among other things, on how fast the charge carriers, which flood the base in the conducting state, can be drawn away towards the anode side. To accelerate the drawing-away process during the turn-off, short circuits are therefore provided on the anode side distributed over the area between the n base and the anode contact which bridge the intermediate p emitter layer.

However, the electrical characteristics of these short circuits cannot be unilaterally arbitrarily selected for an optimized turn-off speed since, at the same time, other characteristics of the component distinctly deteriorate with this optimization, leaving only a limited margin for designing the short circuits.

In addition, once the short circuits have been installed, the turn-off characteristic is fixed and cannot be influenced by further.

A comparable situation also exists in another type of turn-off power semiconductor, the Field Controlled Thyristor (FCTh) which is known, for example, from German Offenlegungsschrift No. 29 32 043. In the FCT, a weakly n-doped channel layer is enclosed by a p-doped anode layer and a n-doped cathode layer. Into the channel layer project p-doped gate areas which are connected to the gate contact and form with the channel a P-N junction which, with a suitable bias voltage, constricts and finally cuts off the current flow through the channel. Here, too, short circuits are provided on the anode side between the anode contact and the channel layer in order to improve the turn-off characteristics.

In another known turn-off component, the thyristor of the static induction type of construction (SITh = Static Induction Thyristor), the problem of improving the turn-off behavior has been solved in a similar manner (see, for example, FIG. 17 of German Offenlegungsschrift No. 30 02 526).

SUMMARY OF THE INVENTION

It is now the object of the present invention to create a turn-off semiconductor component in which the switching behavior, particularly the turn-off behavior can be influenced by control from the outside and which allows it to be used in a novel cascode circuit.

The above object and other objects are achieved according to the present invention by providing a novel turn-off semiconductor device including a plurality of differently doped layers arranged between an anode and a cathode, of which the outer layer on the anode side is a p doped anode layer and the outer layer on the cathode side is a n-doped cathode layer, a first gate structure suitable for controlling turning off the component and having a first gate contact provided on the cathode side, and a second gate structure comparable to the first gate structure and having a second gate contact arranged on the anode side of the component.

The core of the invention consists of providing, in addition to the cathode-side first gate structure, present in known manner in a gate-turn-off semiconductor component, a comparable second anode-side gate structure which, when suitably driven, accelerates the drawing-off of the charge carriers during turn-off, reduces the total power loss and, in particular, offers the possibility of a dual cascode circuit in combination with two field effect transistors.

Although the scope of the invention includes provision of the second gate structure with the second gate contact in any known gate-turn-off semiconductor component, a preferred embodiment of the invention is based on a finely subdivided step-shaped gate structure as is known from European Patent A1 0 121 068 and can be optionally implemented in the form of a GTO or of a FCTh.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of a GTO of the prior art, comprising a first cathode-side gate structure;

FIG. 1B is a cross-sectional view, corresponding to FIG. 1A, through a FCTh of the prior art;

FIG. 2A is a cross-sectional view of a first illustrative embodiment of the invention with a GTO according to FIG. 1A which now has a second, anode-side gate structure in a first configuration;

DESCRIPTION OF THE PREFERRED EMBODIMENTS

Figure 2B:
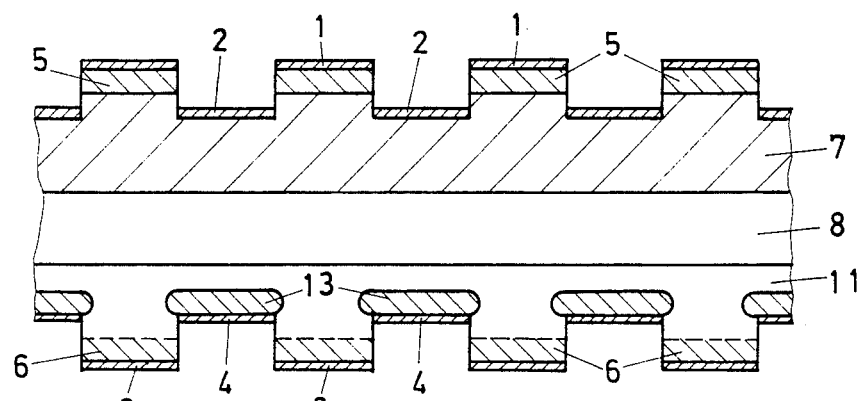
FIG. 2B is a cross-sectional view of a second illustrative embodiment of the invention with a GTO according to FIG. 1A which now has a second anode-side gate structure in a second, field controlled configuration.

Referring now to the drawings, wherein like reference numerals designate identical or corresponding parts throughout the several views, the cross-section through the layer structure of which is known, for example, from European Pat. No. A1 0121 068 and which can be turned off via a gate (here in the form of a GTO) is shown in section in FIG. 1A. Between the anode at the bottom and the cathode at the top, a plurality of layers with different doping is arranged. In detail, these are a p-doped anode layer 6, in most cases called p emitter in the GTO, a n-doped n base layer 8, a p-doped p base layer 7 and a n-doped cathode layer 5 (n emitter) which, in the present case, is subdivided into narrow strip-shaped areas by deep trenches.

The trenches extend from the cathode-side surface into the region of the p base layer 7. At the bottoms of the trenches a first gate contact 2 is provided which forms individual separate areas between the cathode fingers separated by the trenches but represents a coherent metallic contact area outside the cathode fingers.

For the anode and cathode connection, a corresponding anode contact 3 is provided on the underside of the anode layer 6 and cathode contacts 1 are provided on the top sides of the cathode layer 5 or of the cathode fingers, respectively.

Information on the geometric dimensions of the individual layers and the step-shaped gate structure and information on suitable doping concentrations can be found in the European Pat. No. A1 0 121 068 already mentioned so that a more detailed discussion of these is not required at this point.

Another structure, known from this printed document, of a gate-turn-off semiconductor device (now in the form of a FCTh) is reproduced in section in FIG. 1B. In principle, instead of the four-layer sequence from FIG. 1A, a three-layer sequence is here arranged between anode and cathode which contains the previously mentioned (p-doped) anode layer 6, the (n-doped) cathode layer 5 and the first gate contact 2, anode contact 3 and cathode contacts 1 as connection contacts. The two base layers 7 and 8 from FIG. 1A are now replaced by a weakly n-doped n channel layer 10 into which p-doped p gate areas 12 are diffused underneath the bottoms of the trenches and are connected to the first gate contact 2 and, together with the n channel layer 10, form P-N junctions which, with a suitable gate bias voltage, constrict and stop the current flow through the n channel layer 10 between the trenches.

These two device configurations known from European Pat. No. A1 0 121 068 and shown in FIGS. 1A and 1B form the starting point for a total of four illustrative embodiments of the semiconductor device according to the invention comprising a second anode-side gate structure. Two of the four illustrative embodiments (FIG. 2A and 2B) refer to the configuration from Fig. 1A. The two other illustrative embodiments (FIG. 3A and 3B) are based on a configuration according to FIG. 1B.

In the structure shown in FIG. 2A, two significant changes have been made on the anode side, compared with the starting point in FIG. 1A. Specifically on the one hand, the anode layer 6, analogously to cathode layer 5, is now also subdivided into individual narrow strip-shaped areas by trenches reaching into the next layer and the bottoms of these trenches are also provided with a contact, the second gate contact 4. On the other hand, a contacting layer 9, which, compared with the n base layer 8, is more strongly n doped and is intended to impart a good electric contact between the second gate contact 4 and the n base layer 8, is arranged in the n base layer 8, indicated by the dashed line in FIG. 2A, adjoining the anode layer 6. At the same time, this additional layer 9 can also take over the function of a so-called blocking layer, known per se. Tis contacting layer 9, however, does not necessarily have to have a continuous structure but can also be diffused in only locally underneath the second gate contact 4 as indicated by the areas 9', drawn with dashes, in FIGS. 2A and 3A. In this case, the additional function of a blocking layer is omitted.

The anode-side trenches then form a second anode-side gate structure via which the device can be controlled from the outside analogously to the first gate structure. In this manner, the drawing-off of the charge carriers from the n base layer 8 can be effectively supported and the turn-off process distinctly accelerated during the turning-off of the device via the second gate which now exists.

Whilst both gate structures have the construction of a GTO gate in the first illustrative embodiment according to FIG. 2A, the anode-side second gate structure can also be constructed in the manner of the FCTh gate known from FIG. 1B as shown in the second illustrative embodiment of FIG. 2B. In this case, a p-doped channel layer 11, into which n-doped n gate areas 13 project which are diffused in underneath the bottoms of the anode-side trenches, is arranged between the n base layer 8 and the anode layer 6 (FIG. 2B). This then results in a second anode-side gate structure which completely corresponds to the first cathode-side gate structure from FIG. 1B in its geometric design whereas the dopings in the individual layers are in each case exactly opposite, that is to say a p doping is replaced by a n doping and conversely. A device of this type then has a first current-controlled gate and a second field-controlled gate.

Figure 3A:
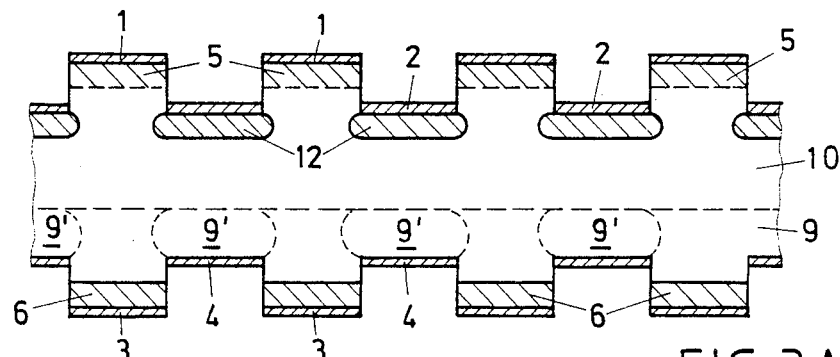
FIG. 3A is a cross-sectional view of a third illustrative embodiment of the invention with a FCTh according to FIG. 1B which now has a second anode-side gate structure in the first configuration according to FIG. 2A.

The third illustrative embodiment of FIG. 3A is based on the known FCTh configuration of FIG. 1B and introduces the second anode-side gate structure by the fact that a contacting layer 9 or 9', which has already been described in the illustrative embodiment of FIG. 2A and which is more strongly n-doped compared with the n channel layer 10, is built into the n channel layer 10 adjoining the anode layer 6. At the same time, corresponding anode-side trenches are also provided again and subdivide the anode layer 6 into narrow strip-shaped areas, project into the contacting layer and at their bottoms are again provided with the second gate contact 4.

Thus, a cathode-side field-controlled first FCTh gate is combined with an anode-side current-controlled second GTO gate in the third illustrative embodiment.

Figure 3B:
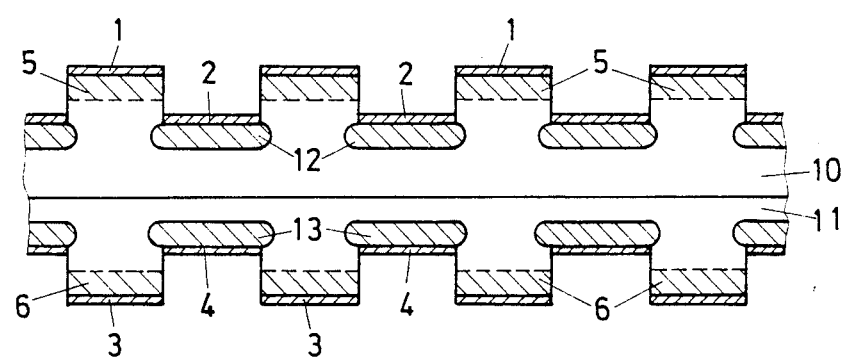
FIG. 3B is a cross-sectional view of a fourth illustrative embodiment of the invention with a FCTh according to FIG. 1B which now has a second anode-side gate structure in the second configuration according to FIG. 2B.

In the fourth illustrative embodiment of Fig. 3B, finally, both gate structures are constructed as field-controlled FCTh gates. Between the anode layer 6 and the cathode layer 5, the p channel layer 11, already known from FIG. 2B and the n channel layer 10, known from FIG. 3A are located here. The P-N junctions needed for field control are formed by the two channel layers 10 and 11 and correspondingly oppositely doped gate areas 12 and 13.

The effects of the second anode-side gate structure on the switching behavior of the semiconductor device have been investigated by means of a computer simulation which is very close to reality. For the computer simulation, a specially developed computer program COMPASS (Computer Program for the Analysis of Semiconductors) which is described and explained in the dissertation by C. Abbas "Transient One-Dimensional Numerical Analysis of Bipolar Power Semiconductor Devices", ETH Zurich, No. 7614, 1984 was used.

As can be seen from this dissertation, the simulation with the COMPASS program leads to realistic results which agree very well with measured values. For this reason, the advantages of the semiconductor device according to the invention compared with the conventional semiconductor device can be directly illustrated by means of the simulation results obtained with this program.

Figure 4:
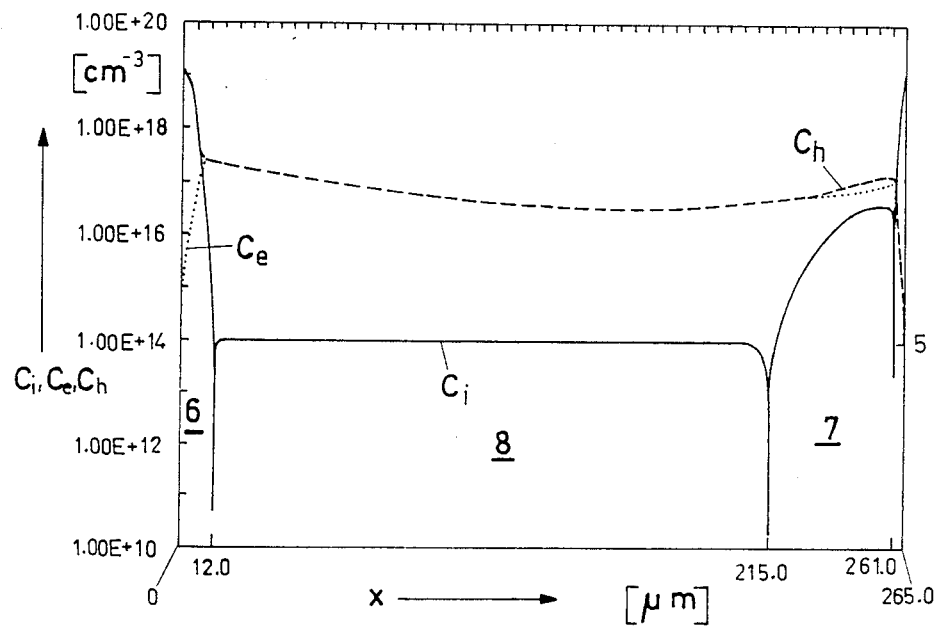
FIG. 4 is a graph showing the contours of the doping concentration and of the electron and hole concentration in a known GTO according to FIG. 1A which have been used as a basis for a comparative simulation calculation.
Figure 5:
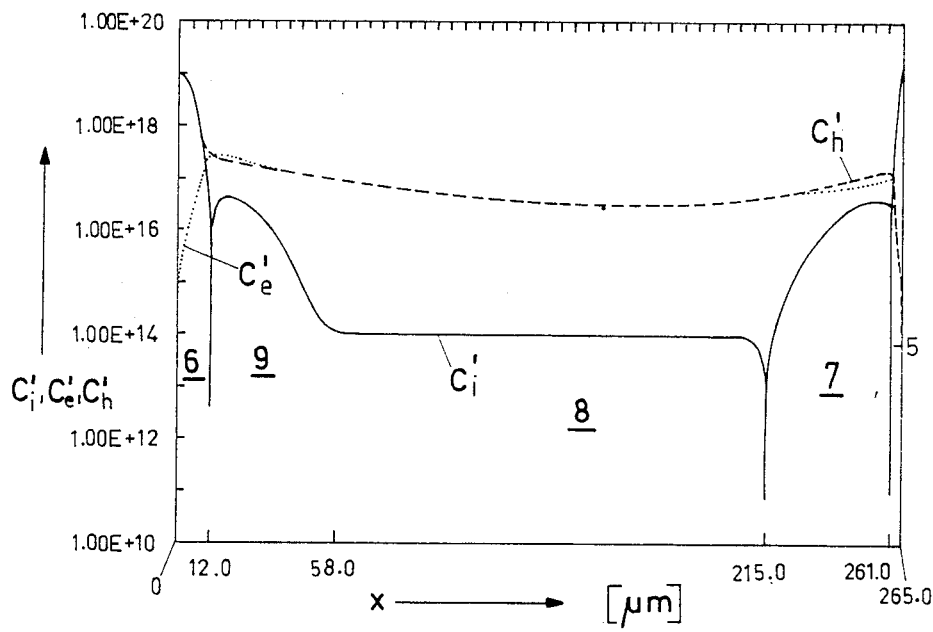
FIG. 5 is a graph showing the contours corresponding to FIG. 4 in a structure according to FIG. 2A for the comparative simulation calculation.

The comparative simulation is based on a doping contour of the doping concentration $c_i$ according to FIG. 4 for the conventional device of FIG. 1A and on a doping contour of the doping concentration $c'_i$ according to FIG. 5 for a novel component according to the illustrative embodiment of FIG. 2A with a dual GTO gate (in the discussion of the simulation result following, the quantities for the conventional device are used without apostrophe and, in contrast, always with apostrophe for the novel device as distinction).

The doping contours from FIGS. 4 and 5 relate to the section lines A—A in FIG. 1A and B—B in FIG. 2A, respectively. The distance from the lower boundary area of the anode layer 6 has been chosen as locus parameter x as is indicated by the arrow drawn in both figures.

As can be seen from FIGS. 4 and 5, the arrangement of the various layers 6, 8, 7, 5 and 6, 9, 8, 7, 5, respectively, has a total thickness of 265 μm in each case, without the contacts, of which 12 μm are the anode layers 6, 46 μm the contacting layer 9, 203 μm and 157 μm, respectively, the n base layer 8, 46 μm the p base layer 7 and 4 μm the cathode layer 5.

In addition to the contours of the doping concentration $c_i$ and $c'_i$, respectively, the electron concentrations $c_e$ and $c'_e$, respectively, and hole concentrations $c_h$ and $c'_h$, respectively, which occur are additionally plotted in FIGS. 4 and 5 to clarify the charge carrier relationships.

The essential difference between the two doping contours shown consists in that, on the anode side, the additional contacting layer 9 with higher n-type doping becomes noticeable by a bump in the contour in the distance between X=12 μm and X=58 μm (FIG. 5).

Figure 6:
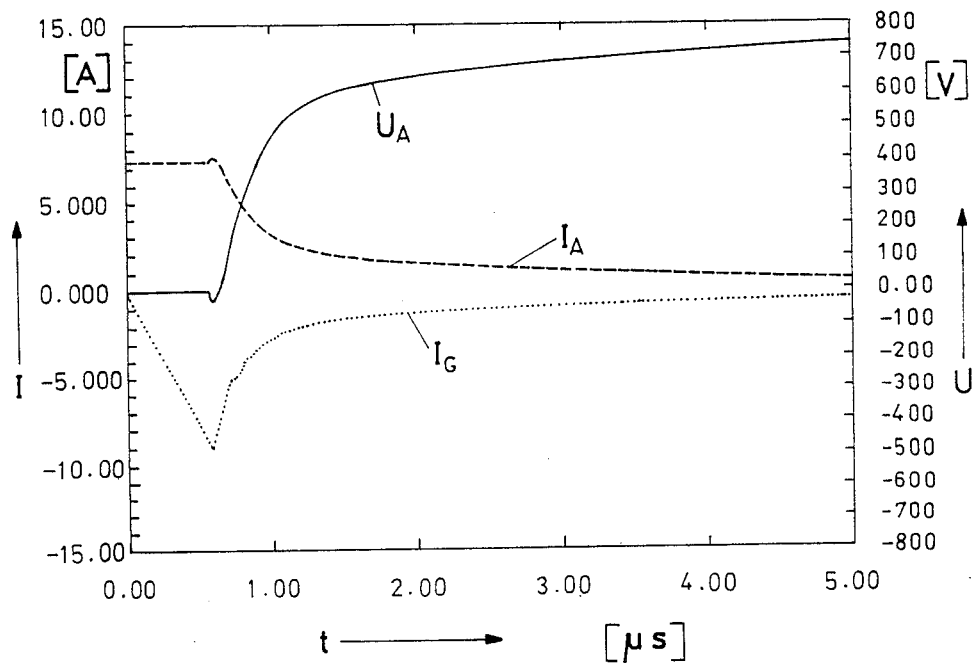
FIG. 6 is a graph showing the time-related turn-off characteristic of the known GTO with the contours according to FIG. 4 as result of the simulation calculation.

As result of the simulation of the turn-off characteristic, the time-related variations of the anode voltage $U_A$ of the anode current $I_A$ and of the gate current $I_G$ are plotted in FIG. 6 for the conventional device (FIG. 1A and 4), an externally applied voltage of 800 V, a load resistance of 109 ohms and a gate voltage of −12 V having been prespecified.

The time sequence of the turn-off process can be clearly seen in which first current is drawn via the gate which, together with the anode current $I_A$, decays after the charge carriers have been cleared out whilst the device increasingly cuts off and correspondingly develops voltage.

Figure 7:
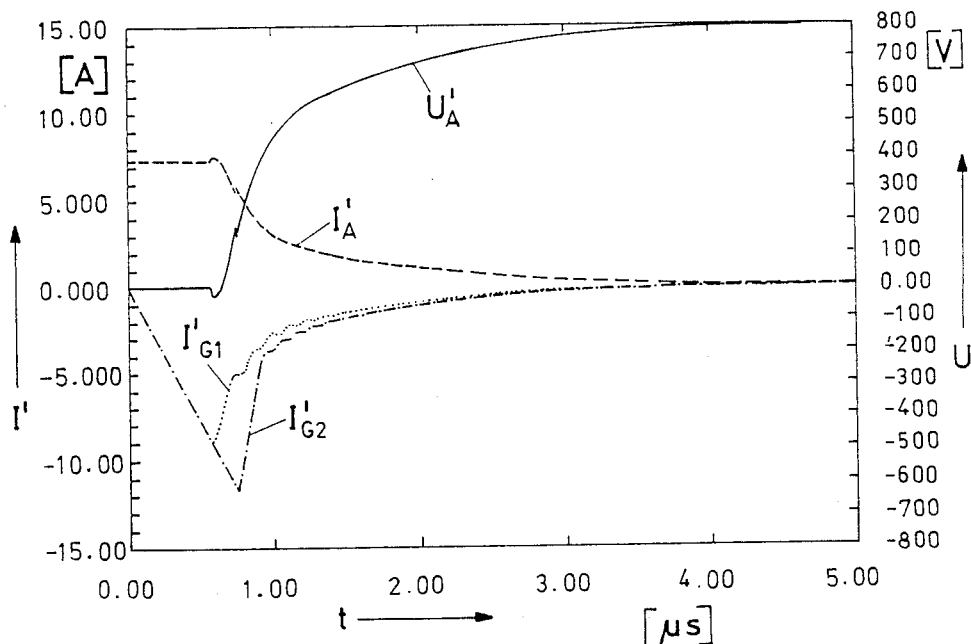
FIG. 7 is a graph showing the turn-off characteristic corresponding to FIG. 6 of the component according to the invention with the contours according to FIG. 5.

The simulation results for a novel dual-gate structure (FIG. 2A and 5), which are comparable to FIG. 6, are reproduced in FIG. 7, the quantities $I'_G1$, $I'_A$ and $U'_A$ with apostrophes correspond to the quantities $I_G$, $I_A$ and $U_A$ whilst the gate current $I'_G2$ for the anode-side second gate is added as a new quantity. The external parameters are otherwise the same as in FIG. 6.

A direct comparison of FIGS. 6 and 7, particularly in the range of time above t=2 μs already reveals that the currents $I'_A$, $I'_G1$ and $I'_G2$ drop more rapidly than the currents $I_A$ and $I_G$. Analogously, the anode voltage $U'_A$ across the novel component also develops more rapidly than the anode voltage $U_A$ of the conventional component.

Figure 8:
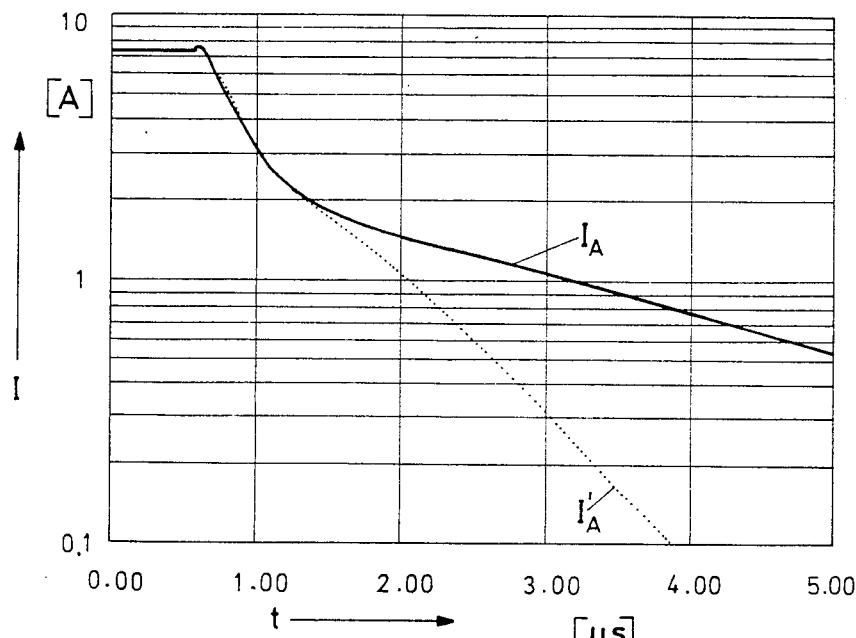
FIG. 8 is a graph showing the comparison between the time-related variation of the anode currents in the turn-off case from FIGS. 6 and 7 at a logarithmic scale.

This difference in the turn-off behavior becomes especially clear in the comparative logarithmic plot of the two anode currents $I_A$ and $I'_A$ against time in FIG. 8.

This FIG. 8 shows that the storage time of the two GTO thyristors is identical (because the configuration has remained the same on the cathode side) but the decay time of the novel dual-gate device is much shorter than that of the conventional device, namely only about 1.6 μs instead of 3.4 μs in the other case. This therefore reveals the clear improvement in the turn-off characteristic due to the second anode-side gate.

Figure 9:
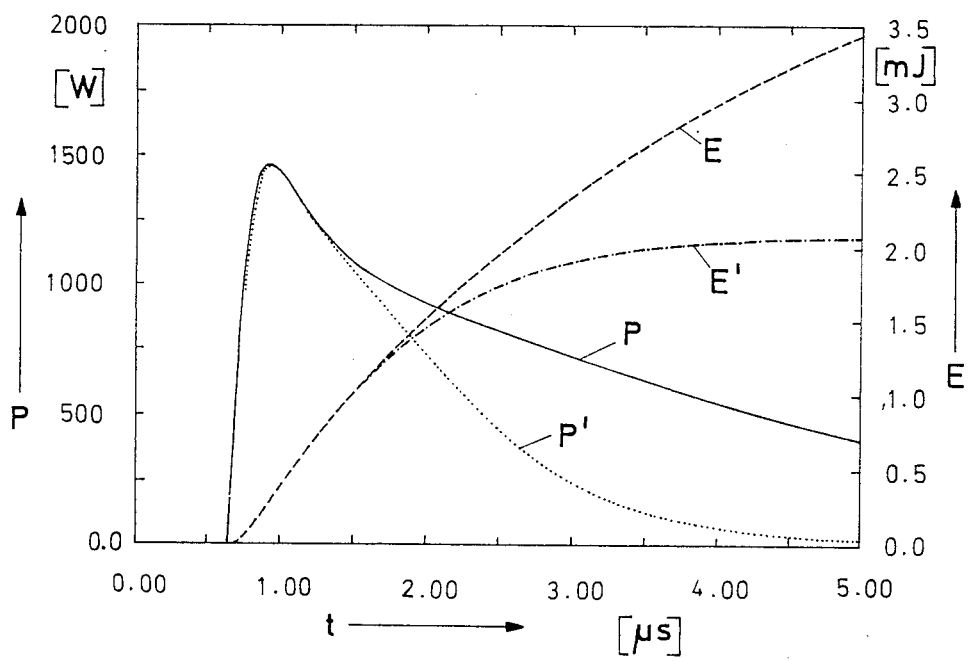
FIG. 9 is a graph showing the comparison between the total power and energy losses for both components in the simulated turn-off characteristic.
Figure 10:
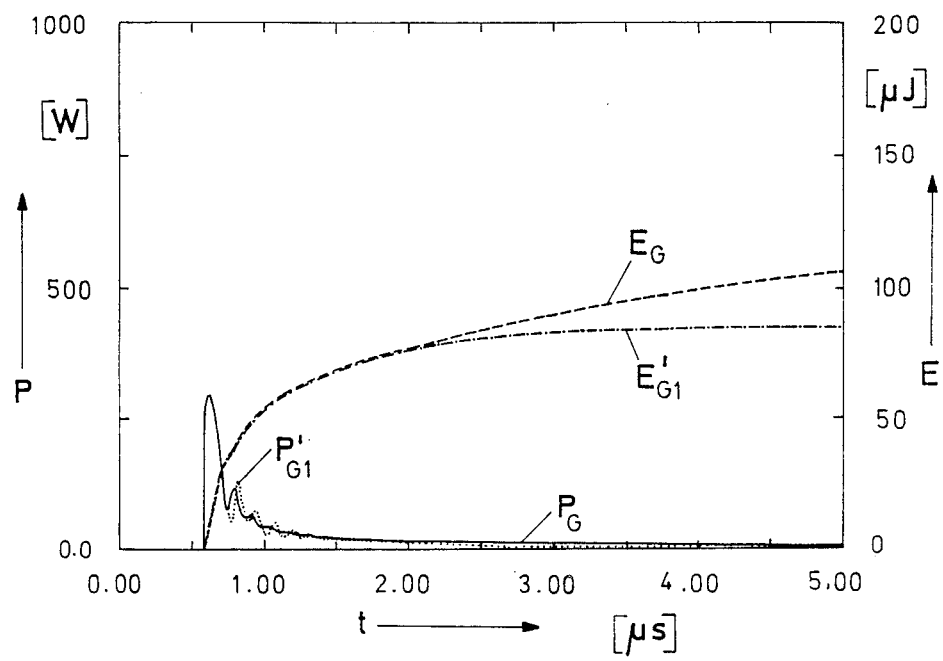
FIG. 10 is a graph showing the comparison between the power and energy losses in cathode-side gate circuits of both components in the simulated turn-off characteristic.

Other advantages can be seen from a direct comparison of the power losses and energy losses (FIG. 9 and 10). Whilst the peak of both power losses P and P' is identical (about 1500 W here), the power loss P' of the novel device drops more rapidly than the power loss P of the conventional GTO. The relationship between the total power losses E' and E of the two devices is also correspondingly more favorable.

Figure 11:
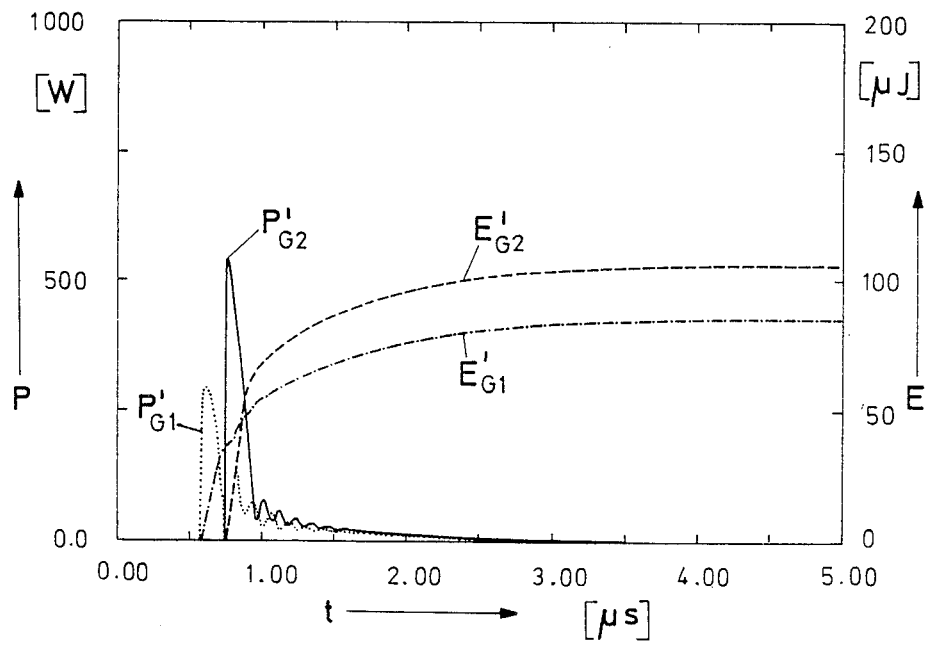
FIG. 11 is a graph showing the comparison between the power and energy losses in the two gate circuits (on the anode side and the cathode side) of the component according to the invention in the simulated turn-off characteristic.

In FIG. 10, the gate power losses $P_G$ and $P'_{G1}$ and the total gate energy losses $E_G$ and $E'_{G1}$ in the cathode-side gate circuits of both devices are compared. Here, too, the total gate energy loss $E'_{G1}$ of the novel device is clearly better. However, on the other hand, it must be taken into consideration that in the novel device, an additional energy loss ($E'_{G2}$ in FIG. 11; power loss: $P'_{G2}$) occurs in the second anode-side gate circuit so that, with two gate circuits, the total energy loss is 0.19 mJ compared with 0.11 mJ with only one gate circuit.

In summary, the effect of the second anode-side gate can be described as follows: firstly, a further injection of charge carriers from the anode during the turn-off process is suppressed by the controlling action via the second gate Secondly, the charge carriers stored in the base layer are also removed at the anode side. In the illustrative embodiments of FIG. 2A and 3A, in which the second gate is a GTO gate, this is done even without there being a P-N junction between the second gate contact 4 and the charge carriers stored in the n base layer 8.

Compared with the anode short circuits used in the prior art, the device according to the invention has the advantage that the additional anode-side gate circuit can be used for influencing the switching behavior by circuit means and that, as described in the text which follows, the device can be used in a novel dual cascode circuit.

Figure 12A:
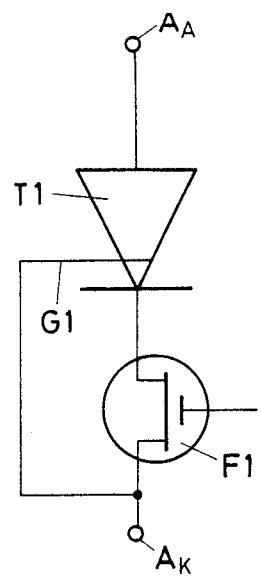
FIG. 12A is a circuit diagram showing a simple cascode circuit of a known turn-off component with a field effect transistor (FET)

A simple cascode circuit with a conventional gate-turn-off semiconductor device and a power MOSFET is shown in FIG. 12A. This combination of devices includes the series circuit of a thyristor T1 and of a field-effect transistor F1 between an anode-side external connection $A_A$ and a cathode-side external connection $A_K$, the field effect transistor F1 being arranged at the cathode side of the thyristor T1. The gate G1 of the thyristor T1 is extended to the cathode-side external connection $A_K$.

In this cascode circuit, the field effect transistor F1 must be capable of carrying the total load current when the combination of devices is in the conducting state. In the turned-off state, in contrast, the bipolar thyristor T1 handles the entire reverse voltage.

If, in order to switch off the cascode the control voltage is removed from the gate of the MOSFET the latter will cut off within a few 100 nsec and the current is mandatorily commutated from the cathode of the thyristor T1 to its gate circuit (G1). The thyristor T1 then abruptly turns off and the total reverse voltage is developed across it.

Figure 12B:
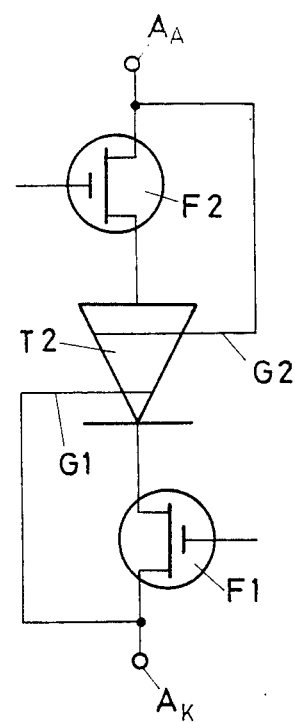
FIG. 12B is a circuit diagram showing the use according to the invention of the novel component in a dual cascode circuit comprising two FETs.

The novel semiconductor component with dual gate can be used for constructing a dual cascode circuit according to FIG. 12B. The thyristor T2 is here connected in series with a first FET F1 at the cathode side and with a second FET F2 at the anode side between the cathode-side and anode-side external connections $A_K$ and $A_A$. The first gate G1 is connected to $A_K$ and the second gate G2 is connected to $A_A$.

If then both MOSFETs F1 and F2 in this dual cascode circuit are turned off via their gate connections, the load current is commutated to the gate circuit of the first gate G1 at the cathode side and to the gate circuit with the second gate G2 at the anode side. The consequence of this is that the accelerated turn-off achieved by means of the second gate is also fully effective in this circuit arrangement.

Overall, the novel semiconductor device provides a turn-off device which has the following advantages:
more rapid turn-off
lower total power loss
possible use in a dual cascode circuit
more rapid turn-on
second gate structure can be generated by means of the
same processes as the first one.

Naturally, the arrangement of a second anode-side gate structure is not restricted to the layer structures of the four illustrative embodiments explained but can be implemented in a simple manner within the scope of the invention in an gate-turn-off semiconductor device.

Obviously, numerous modifications and variations of the present invention are possible in light of the above teachings. It is therefore to be understood that within the scope of the appended claims, the invention may be practiced otherwise than as specifically described herein.

I claim:

1. Turn-off semiconductor device comprising:
a cathode and an anode;
a plurality of differently doped layers arranged between said cathode and said anode, said plurality of differently doped layers defining the inner structure of a thyristor which can be turned off via a gate and comprising a four-layer sequence consisting of an outer layer on an anode side which is a p-doped anode layer, an n base layer, a p base layer and an outer layer on a cathode side which is an n-doped cathode layer;
a first gate arranged on the cathode side for controlling turning off the device and having a first gate contact, wherein said cathode layer is subdivided into strip-shaped areas by first trenches projecting into the p base layer and the first gate contact is formed at the bottoms of said first trenches, thereby creating a step-like current controlled gate-cathode structure;
a weakly p-doped channel layer provided between the n base layer and the anode layer; and
a second gate arranged on the anode side and having a second gate contact, wherein said anode layer is subdivided into strip-shaped areas by second trenches projecting into the p channel layer, and the second gate contact is arranged in each case at the bottoms of said second trenches and is separated from the p channel layer by n gate area located thereunder, thereby creating a step-like field-controlled gate-anode structure.

2. Use of the turn-off semiconductor device, as claimed in claim 1, in a dual cascode circuit in which the cathode is connected via a series source-drain path of a first field effect transistor to a cathode-side external connection and on the anode side via a series source-drain path of a second field-effect transistor to an anode-side external connection; and in which the first gate contact is connected to the cathode-side external connection and the second gate contact is connected to the anode-side external connection.

* * * * *